United States Patent
Lam et al.

(10) Patent No.: US 7,494,545 B2
(45) Date of Patent: Feb. 24, 2009

(54) EPITAXIAL DEPOSITION PROCESS AND APPARATUS

(75) Inventors: Andrew Lam, San Francisco, CA (US); Yihwan Kim, Milpitas, CA (US); Satheesh Kuppurao, San Jose, CA (US); See-Eng Phan, San Jose, CA (US); Xinliang Lu, Sunnyvale, CA (US); Chien-Teh Kao, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 11/346,804

(22) Filed: Feb. 3, 2006

(65) Prior Publication Data

US 2007/0181057 A1    Aug. 9, 2007

(51) Int. Cl.
*C30B 25/12* (2006.01)
(52) U.S. Cl. .............. 117/84; 117/89; 257/1; 438/638
(58) Field of Classification Search ............ 117/1, 117/84, 89; 257/1; 438/1, 638
See application file for complete search history.

(56) References Cited

U.S. PATENT DOCUMENTS

| | | | |
|---|---|---|---|
| 4,985,372 A | 1/1991 | Narita | |
| 5,089,441 A | 2/1992 | Moslehi | |
| 5,352,636 A | 10/1994 | Beinglass | |
| 5,403,434 A | 4/1995 | Moslehi | |
| 5,899,752 A | 5/1999 | Hey et al. | |
| 6,494,959 B1 | 12/2002 | Carlson et al. | |
| 6,800,830 B2 * | 10/2004 | Mahawili | 219/21.41 |
| 6,808,564 B2 | 10/2004 | Dietze | |
| 6,911,401 B2 | 6/2005 | Khandan et al. | |
| 6,958,286 B2 | 10/2005 | Chen et al. | |
| 2003/0098125 A1 | 5/2003 | An | |
| 2004/0194799 A1* | 10/2004 | Kim et al. | 134/1.3 |
| 2005/0230350 A1 | 10/2005 | Kao et al. | |
| 2008/0160210 A1 | 7/2008 | Yang et al. | |

FOREIGN PATENT DOCUMENTS

| | | |
|---|---|---|
| EP | 1568797 | 8/2005 |
| JP | 02-256235 | 10/1990 |

OTHER PUBLICATIONS

International Search Report for PCT/US2007/001031 pp. 1-3.

* cited by examiner

*Primary Examiner*—Felisa C Hiteshew
(74) *Attorney, Agent, or Firm*—Diehl Servilla LLC; Scott S. Servilla, Esq.

(57) ABSTRACT

An epitaxial deposition process including a dry etch process, followed by an epitaxial deposition process is disclosed. The dry etch process involves placing a substrate to be cleaned into a processing chamber to remove surface oxides. A gas mixture is introduced into a plasma cavity, and the gas mixture is energized to form a plasma of reactive gas in the plasma cavity. The reactive gas enters into the processing chamber and reacts with the substrate, forming a thin film. The substrate is heated to vaporize the thin film and expose an epitaxy surface. The epitaxy surface is substantially free of oxides. Epitaxial deposition is then used to form an epitaxial layer on the epitaxy surface.

10 Claims, 5 Drawing Sheets

EPITAXIAL DEPOSITION PROCESS AND APPARATUS

TECHNICAL FIELD

Embodiments of the present invention pertain to epitaxial deposition methods, systems and apparatus. In particular, epitaxial deposition methods, systems and apparatus that involve a cleaning process used to remove surface oxide prior to the epitaxy process are disclosed.

An epitaxial layer is a crystalline film grown over a crystalline substrate. The underlying substrate acts as a template for the growing film, so that the crystallographic characteristics of the epitaxial layer are defined by the underlying crystalline substrate. That is, the crystalline substrate provides a crystallographic seed for the epitaxial growth. The substrate may be, for example, monocrystalline silicon, silicon germanium or an SOI wafer.

Growth of the epitaxial layer is commonly achieved using chemical vapor deposition (CVD). The substrate wafer is loaded into a CVD reactor, which is then purged with a non-reactive gas such as He, Ar, $N_2$, or $H_2$. The temperature of the reactor is ramped up, and a mixture of a carrier gas and a reactive gas is introduced into the reactor. Reactive gases may include, but are not limited to, silane ($SiH_4$), disilane ($Si_2H_6$), trisilane ($Si_3H_8$), dichlorosilane ($SiH_2Cl_2$), trichlorosilane ($SiHCl_3$), and silicon tetrachloride ($SiCl_4$). Dopant gases may also be introduced, such as arsine ($AsH_3$), phosphine ($PH_3$) and diborane ($B_2H_6$). The carrier gas is typically hydrogen. When a desired thickness of the epitaxial layer has been achieved, non-reactive gases are again used to purge the reactor, and the temperature is ramped down.

However, for the epitaxial process to perform successfully, it is important that the amount of oxide present on the crystalline substrate be minimized. If the surface oxygen content of the substrate is too high, the epitaxial growth process will be detrimentally affected, as the oxygen atoms interfere with the crystallographic placement of the depositing material on the seed substrate. For example, in silicon epitaxial deposition, excess oxygen on the crystalline substrate can cause silicon atoms to become displaced from their epitaxial positions by atomic-scale clusters of oxygen atoms. This local atomic displacement can create an error in the subsequent atomic ordering as the layer is grown thicker. This phenomenon may be referred to as the so-called stacking fault, alternatively referred to as hillock defects. Oxygenation of the substrate surface may occur, for example, when the substrate is exposed to ambient air when transported between various fabrication stations.

To avoid defects caused by surface oxygen, prior to the epitaxial deposition process the residual surface oxygen should be removed from the crystallographic substrate. For example, the substrate may be annealed in a hydrogen atmosphere at a temperature in excess of 1000° C., using what may be referred to in the art as a hydrogen pre-bake. However, such high temperature processes are expensive in terms of thermal budgeting. Therefore, instead, an ex-situ wet diluted hydrofluoric (HF) acid etching is typically performed prior to loading of the substrate into the epitaxy reactor. This process is sometimes referred to in the art as HF-last. The substrate may be dried after rinsing and passivated with hydrogen, which, for silicon substrates, populates the substrate surface with Si—H bonds that slow native oxide growth, which can occur when the wafer is exposed to ambient air while transferred from the wet HF etch station to the expitaxy reactor. Because of the minor oxidation that does still occur (assuming that ambient exposure is kept to a minimum), a relatively light hydrogen pre-bake can be performed in-situ, such as at temperatures of less than 900° C. for 30 to 120 seconds. After the pre-bake step, the epitaxial deposition process may be performed.

Although the HF-last pre-clean step is effective in the removal of native oxide from the substrate surface, it introduces a certain amount of complexity into the manufacturing process. First, because it is a wet process, HF-last imposes an inherent queue time between the wet-clean station and the epitaxy deposition reactor. Secondly, the isotropic etching of the diluted HF solution used in the HF-last pre-clean step may undercut oxide. Finally, selectivity issues arise with the oxide-nitride-silicon etch rates in the HF solution for silicon substrates. Reduction of the impact of any of these issues on the manufacturing process could improve manufacturing throughput. It would therefore be desirable to replace the wet HF pre-clean step with a dry pre-clean step that may be easily integrated into a "zero-ambient exposure" processing system.

DISCLOSURE OF THE INVENTION

In one aspect of the present invention, a multi-chamber processing apparatus includes a dry etch processor including a chamber adapted to form a plasma in vacuum-tight connection with an epitaxial deposition reactor. A dry etch process utilizing a plasma is performed upon a substrate within the dry etch processor to remove oxide from the surface of the substrate to expose an epitaxy surface. The substrate is then transferred from the dry etch processor to the epitaxial deposition reactor without exposure to ambient air. The epitaxial deposition reactor is then used to form an epitaxial layer on the epitaxy surface.

In another aspect, the dry etch process involves placing a substrate to be cleaned into a processing chamber. A gas mixture is introduced into a plasma cavity separated from the processing chamber. A plasma is formed in the plasma cavity to energize the gas and thereby form a reactive gas. The reactive gas then enters into the processing chamber and reacts with surface oxide on the substrate, forming a film. The substrate is heated to vaporize the film and expose an epitaxy surface. The epitaxy surface is substantially free of oxide. An epitaxy layer is then formed on the epitaxy surface.

BEST MODE FOR CARRYING OUT THE INVENTION

Before describing several exemplary embodiments of the invention, it is to be understood that the invention is not limited to the details of construction or process steps set forth in the following description. The invention is capable of other embodiments and of being practiced or being carried out in various ways.

Aspects of the invention relate to systems, apparatus and methods for epitaxial deposition of films onto substrates. As will be appreciated by the skilled artisan, well-known semiconductor processing equipment and techniques relating to epitaxial deposition are not described in detail in the following so as to not unnecessarily obscure the present invention. Persons skilled in the art will readily recognize that process parameter values will vary significantly depending on the particular environment, substrate type, etc. As such, a comprehensive list of possible values and conditions is neither practical nor necessary, as such values can be determined once the principles of the present invention are known.

Embodiments of the invention relate to cleaning a substrate, for example, silicon, prior to epitaxial deposition using a plasma. Aspects of the invention may be carried out in a cluster tool. Generally, a cluster tool is a modular system comprising multiple chambers which perform various functions including substrate center-finding and orientation, degassing, annealing, deposition and/or etching. According to an embodiment of the present invention, a cluster tool includes an oxidation chamber configured to perform the inventive oxide growth processes. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. However, the exact arrangement and combination of chambers may be altered for purposes of performing specific steps of a fabrication process, which includes the present cleaning process.

Figure 1:
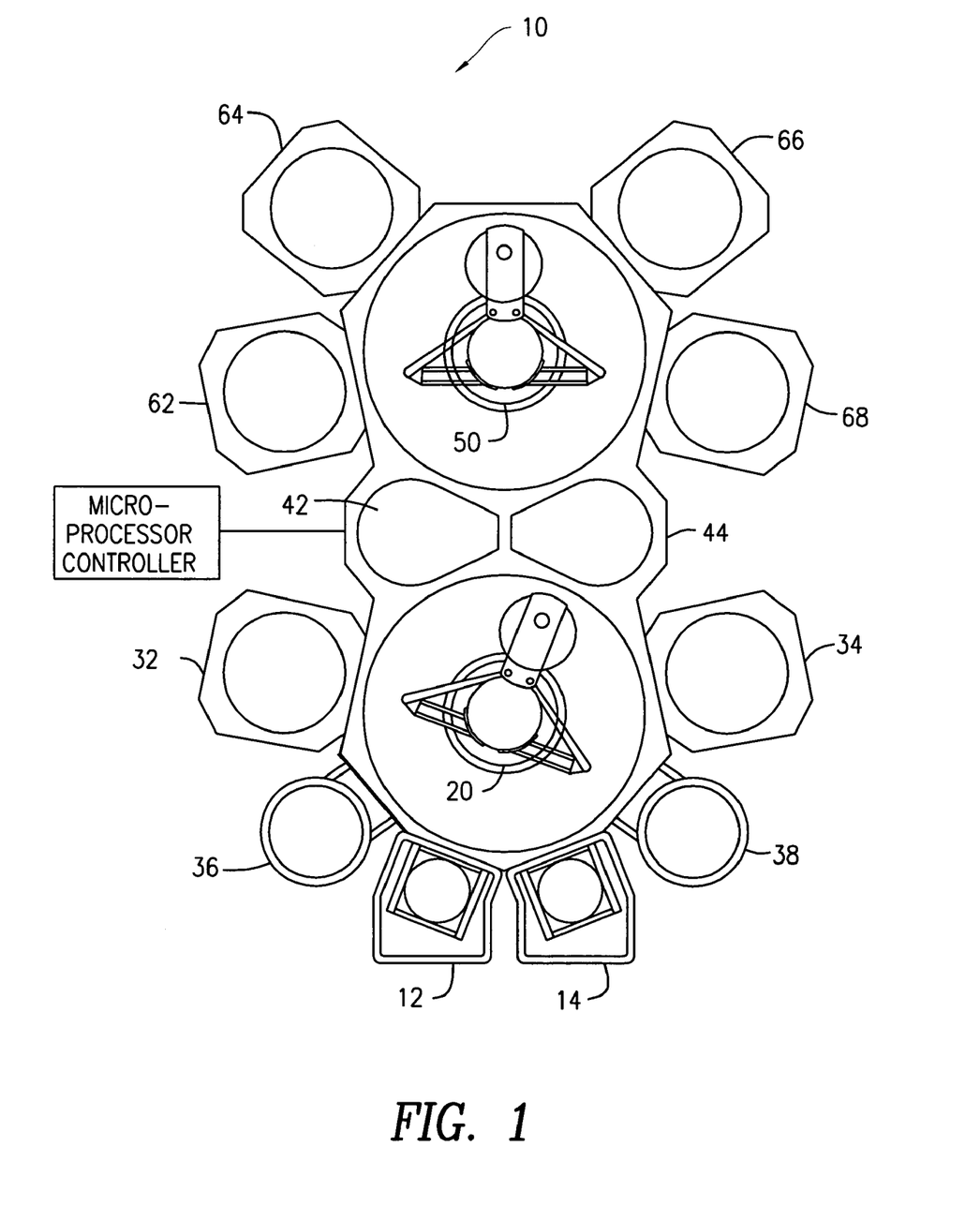
FIG. 1 shows a multi-chamber processing system according to one aspect of the invention.

FIG. 1 shows an example of a cluster tool or multi-chamber processing system 10 according to one aspect of the invention. The processing system 10 can include one or more load lock chambers 12, 14 for transferring substrates into and out of the system 10. Typically, since the system 10 is under vacuum, the load lock chambers 12, 14 may "pump down" substrates introduced into the system 10. A first robot 20 may transfer the substrates between the load lock chambers 12, 14, and a first set of one or more substrate processing chambers 32, 34, 36, 38. Each processing chamber 32, 34, 36, 38, may be configured to perform a number of substrate processing operations. In particular, processing chamber 32 is a dry etch processor designed to practice a dry etch process described in the following, and processing chamber 34 is an epitaxial deposition reactor. Processing chambers 36, 38 may be configured to further provide, for example, cyclical layer deposition (CLD), atomic layer deposition (ALD), chemical vapor deposition (CVD), physical vapor deposition (PVD), etch, pre-clean, degas, orientation and other substrate processes.

The first robot 20 can also transfer substrates to/from one or more transfer chambers 42, 44. The transfer chambers 42, 44 can be used to maintain ultrahigh vacuum conditions while allowing substrates to be transferred within the system 10. A second robot 50 can transfer the substrates between the transfer chambers 42, 44 and a second set of one or more processing chambers 62, 64, 66, 68. Similar to processing chambers 32, 34, 36, 38, the processing chambers 62, 64, 66, 68 can be configured to perform a variety of substrate processing operations, including the dry etch processes described in the following, in addition to cyclical layer deposition (CLD), atomic layer deposition (ALD), chemical vapor deposition (CVD), physical vapor deposition (PVD), epitaxial deposition, etch, pre-clean, degas, and orientation. Any of the substrate processing chambers 32, 34, 36, 38, 62, 64, 66, 68 may be removed from the system 10 if not needed.

Figure 2A:
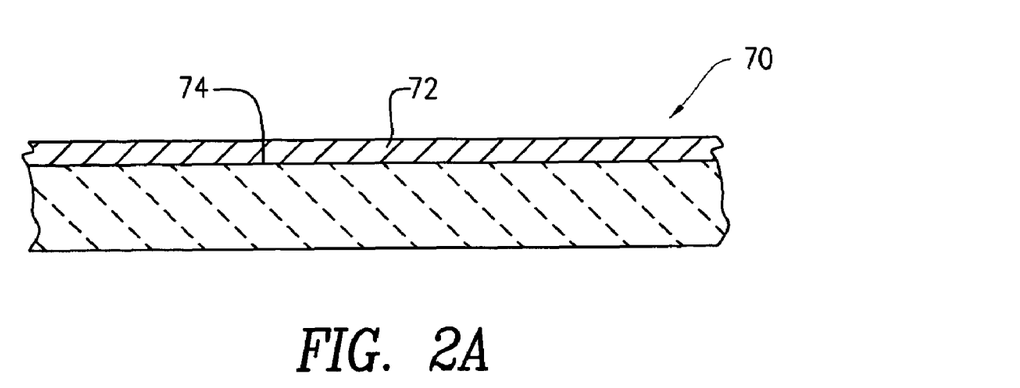
FIGS. 2A-2C show a substrate being processed according to an embodiment of the present invention.
Figure 2B:
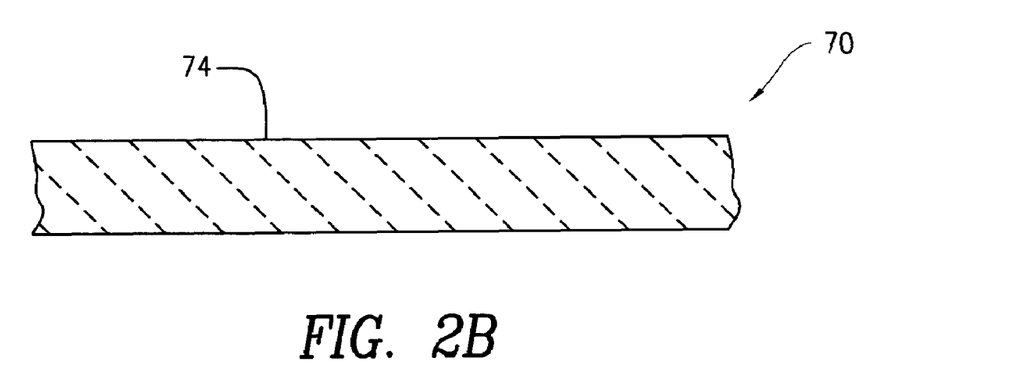
Figure 2C:
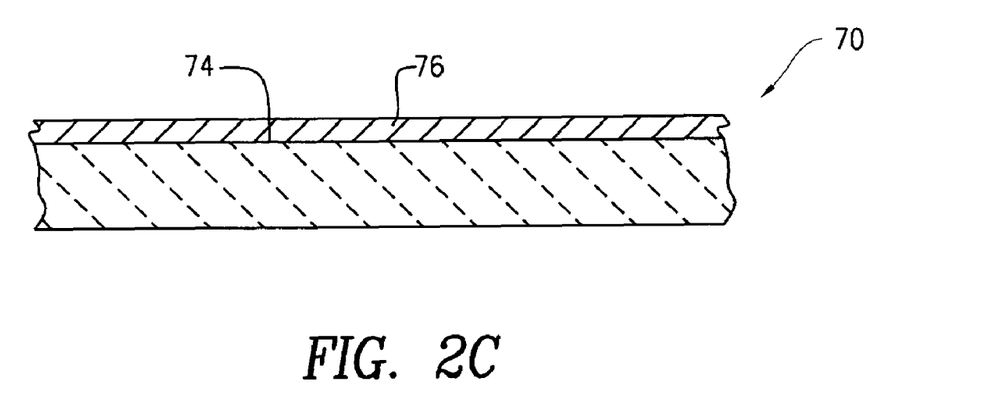

Referring now to FIGS. 2A-2C, an example of an epitaxial deposition process includes a dry pre-clean step to remove surface oxide 72 from a substrate 70, followed by an epitaxial deposition process. To this end, prior to performing the epitaxial deposition process, the substrate 70 to be processed is first loaded into the dry etch processor 100 to undergo a mild, dry etching process that removes surface oxide 72. This dry cleaning process exposes an epitaxy surface 74 on the surface of the substrate 70, as shown in FIG. 2B, which is suitable to sustain the subsequent growth of an epitaxial layer. The dry etch processor 100, and the related dry etching process, are described in detail in commonly-assigned U.S. patent application Ser. No. 11/063,645, filed Feb. 22, 2005 and entitled "In-situ Dry Clean Chamber for Front End of Line Fabrication", published as United States Application Publication No. 20050230350, which is incorporated in its entirety herein by reference. After the dry cleaning process has been completed, the substrate 70 is transferred from the dry etch processor 100 into the epitaxial deposition reactor 34 by robot 20. Because the entire system 10 is load locked, the substrate 70 is not exposed to ambient air when transferred, and hence does not experience native oxide growth on the substantially oxide-free epitaxy surface 74. As such, when the epitaxial deposition process is subsequently performed, an extensive hydrogen pre-bake is not required, or, alternatively, only a very limited duration hydrogen pre-bake may be utilized. Although specific reference in this description is made to silicon, it will be appreciated that the epitaxy surface 74 may be any surface suitable for supporting epitaxial deposition, such as, but not limited to, silicon germanium, doped silicon, and all other Group-IV, Group III-V, and Group II-VI semiconductors and alloys.

The epitaxial deposition process may be carried out by chemical vapor deposition performed within the epitaxial deposition reactor 34, such as within an EPI CENTURA reactor from Applied Materials of Santa Clara, Calif., to form an epitaxy layer 76 on the epitaxy surface 74. The epitaxy surface 74 of the substrate 70 may be exposed, for example, to silicon in the form of a deposition gas mixture that comprises silicon (e.g., $SiCl_4$, $SiHCl_3$, $SiH_2Cl_2$, $SiH_3Cl$, $Si_2H_6$, or $SiH_4$) and a carrier gas (such as $N_2$ and/or $H_2$). If the intended use of the substrate 70 requires that the epitaxial layer 76 include a dopant, the silicon-containing gas may also include a suitable dopant-containing gas, such as arsine ($AsH_3$), phosphine ($PH_3$), and/or diborane ($B_2H_6$).

If $SiH_2Cl_2$ is used, the pressure within the deposition reactor 34 during deposition may be from about 500 to about 760 Torr. If, on the other hand, $SiH_4$ or another Group-IV hydride is used, the deposition reactor 34 pressure should be below 100 Torr. Epitaxial deposition using $SiHCl_3$ may be conducted at atmospheric pressure. Epitaxial deposition using $SiHCl_3$ at atmospheric pressure may be preferable if the epitaxial deposition reactor 34 and the dry etch processor 100 are not connected to a common, load-locked system, but are instead individual units in which the substrate 70 is loaded and extracted under ambient conditions. It will be appreciated that if the epitaxy surface 74 is thereby exposed to ambient air, it may be necessary to first perform a light hydrogen pre-bake in the epitaxial deposition reactor 34 prior to the epitaxial deposition process to remove any resultant native oxide from the epitaxy surface 74. The term "ambient air" typically means the air within a fabrication room. However, ambient air may also include environments that have enough oxygen to cause oxidization of the epitaxy surface 74 sufficient to create defects or flaws in a subsequent epitaxial process that are unacceptable from a process quality control point of view.

During the epitaxial deposition process, the temperature of the epitaxy surface 74 is preferably maintained at a temperature sufficient to prevent the silicon-containing gas from depositing polycrystalline silicon onto the epitaxy surface 74. The temperature of the epitaxy surface 74 during epitaxial deposition may be, for example, between about 1150° C. to about 450° C.

Once an epitaxial layer 76 having the desired thickness has been formed on the epitaxy surface 74, the epitaxial deposition reactor 34 may be purged with a noble gas, $H_2$, or a combination thereof. The substrate 70 may then be cooled, say to a temperature of less than 700° C., and then removed from the epitaxial deposition reactor 34 for subsequent processing.

Figure 3:
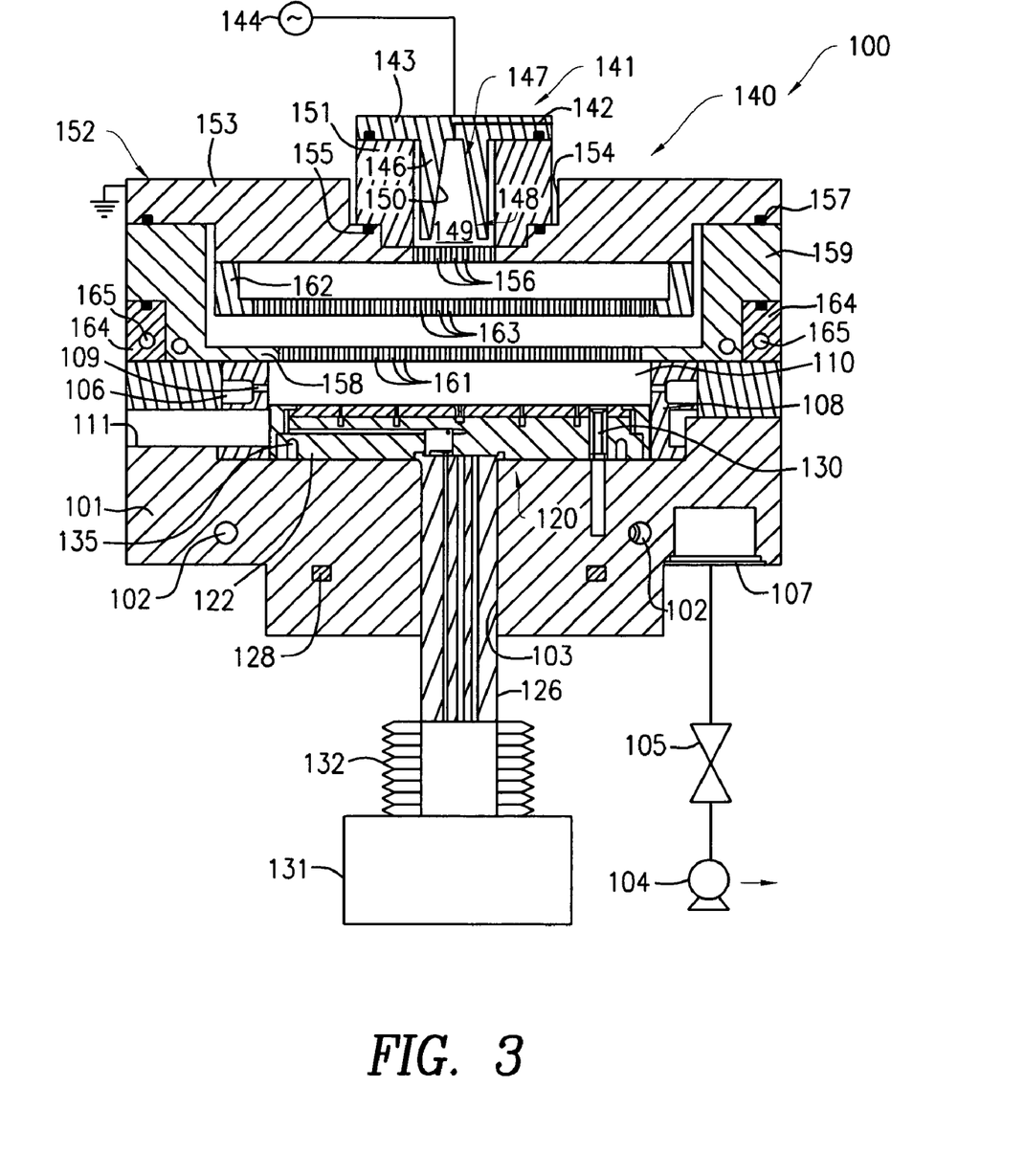
FIG. 3 is a partial cross sectional view showing one embodiment of a dry etch processing chamber.

FIG. 3 is a partial cross sectional view showing an illustrative processing chamber 100. The processing chamber 100 may include a chamber body 101, a lid assembly 140, and a support assembly 120. The lid assembly 140 is disposed at an upper end of the chamber body 101, and the support assembly 120 is at least partially disposed within the chamber body 101. The chamber body 101 may include a slit valve opening 111 formed in a sidewall thereof to provide access to the interior of the processing chamber 100. The slit valve opening 111 is selectively opened and closed to allow access to the interior of the chamber body 101 by first robot 20.

The chamber body 101 may include a channel 102 formed therein for flowing a heat transfer fluid therethrough. The heat transfer fluid can be a heating fluid or a coolant and is used to control the temperature of the chamber body 101 during processing and substrate transfer. Exemplary heat transfer fluids include water, ethylene glycol, or a mixture thereof. An exemplary heat transfer fluid may also include nitrogen gas.

The chamber body 101 can further include a liner 108 that surrounds the support assembly 120. The liner 108 is preferably removable for servicing and cleaning. The liner 108 can be made of a metal such as aluminum, or a ceramic material. However, the liner 108 can be any process compatible material. The liner 108 can be bead blasted to increase the adhesion of any material deposited thereon, thereby preventing flaking of material which results in contamination of the processing chamber 100. The liner 108 may include one or more apertures 109 and a pumping channel 106 formed therein that is in fluid communication with a vacuum system. The apertures 109 provide a flow path for gases into the pumping channel 106, which provides an egress for the gases within the processing chamber 100.

The vacuum system can include a vacuum pump 104 and a throttle valve 105 to regulate flow of gases through the processing chamber 100. The vacuum pump 104 is coupled to a vacuum port 107 disposed on the chamber body 101 and therefore is in fluid communication with the pumping channel 106 formed within the liner 108.

Apertures 109 allow the pumping channel 106 to be in fluid communication with a processing zone 110 within the chamber body 101. The processing zone 110 is defined by a lower surface of the lid assembly 140 and an upper surface of the support assembly 120, and is surrounded by the liner 108. The apertures 109 may be uniformly sized and evenly spaced about the liner 108. However, any number, position, size or shape of apertures may be used, and each of those design parameters can vary depending on the desired flow pattern of gas across the substrate receiving surface as is discussed in more detail below. In addition, the size, number and position of the apertures 109 are configured to achieve uniform flow of gases exiting the processing chamber 100. Further, the aperture size and location may be configured to provide rapid or high capacity pumping to facilitate a rapid exhaust of gas from the chamber 100. For example, the number and size of apertures 109 in close proximity to the vacuum port 107 may be smaller than the size of apertures 109 positioned farther away from the vacuum port 107.

Figure 4:
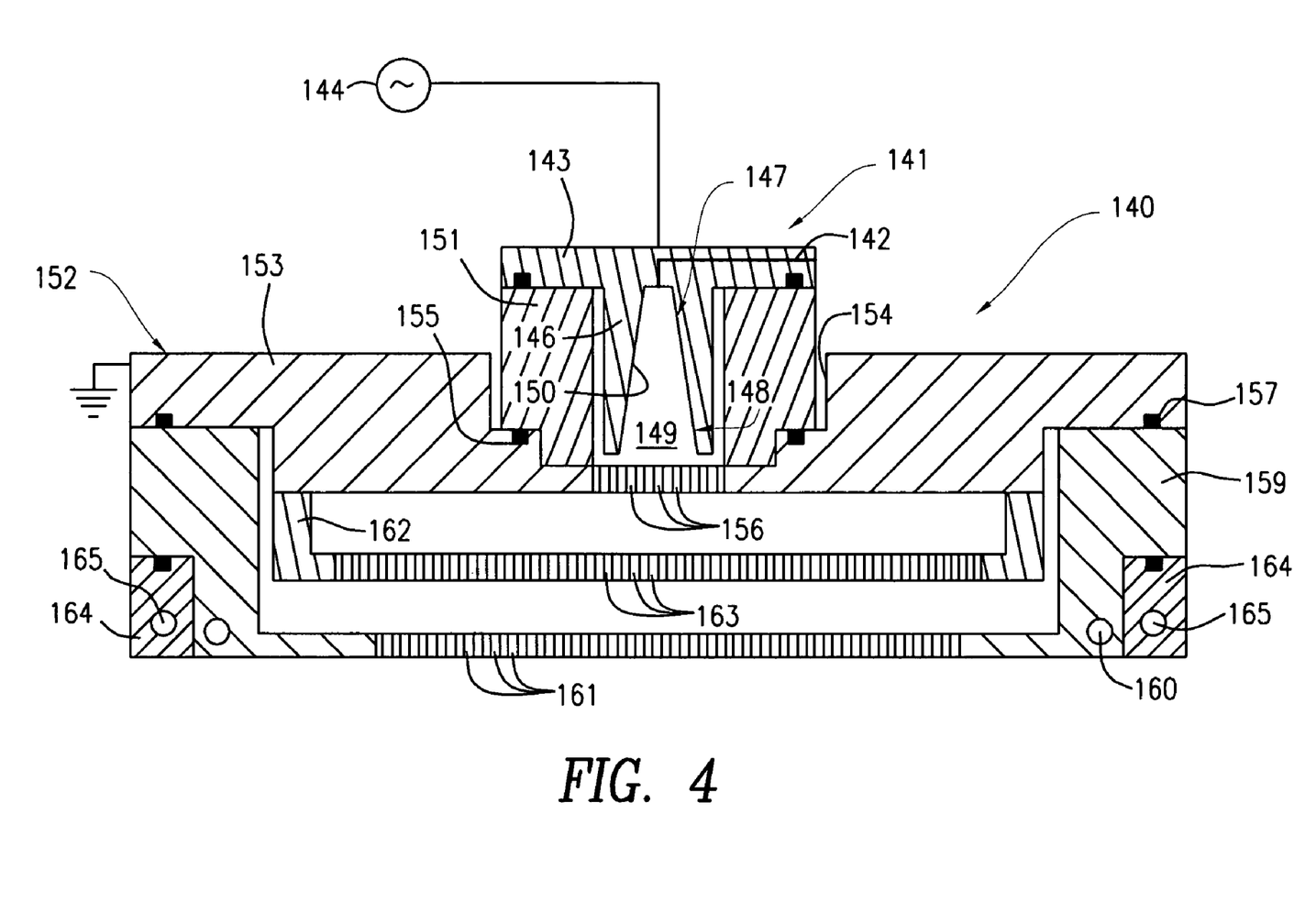
FIG. 4 shows an enlarged cross sectional view of a lid assembly shown in FIG. 3.

Considering the lid assembly 140 in more detail, FIG. 4 shows an enlarged cross sectional view of lid assembly 140 that may be disposed at an upper end of the chamber body 101. Referring to FIGS. 3 and 4, the lid assembly 140 includes a number of components stacked on top of one another to form a plasma region or cavity therebetween. The lid assembly 140 may include a first electrode 141 ("upper electrode") disposed vertically above a second electrode 152 ("lower electrode") confining a plasma volume or cavity 149 therebetween. The first electrode 141 is connected to a power source 144, such as an RF power supply, and the second electrode 152 is connected to ground, forming a capacitance between the two electrodes 141, 152.

The lid assembly 140 may include one or more gas inlets 142 (only one is shown) that are at least partially formed within an upper section 143 of the first electrode 141. One or more process gases enter the lid assembly 140 via the one or more gas inlets 142. The one or more gas inlets 142 are in fluid communication with the plasma cavity 149 at a first end thereof and coupled to one or more upstream gas sources and/or other gas delivery components, such as gas mixers, at a second end thereof. The first end of the one or more gas inlets 142 may open into the plasma cavity 149 at the uppermost point of the inner diameter 150 of expanding section 146. Similarly, the first end of the one or more gas inlets 142 may open into the plasma cavity 149 at any height interval along the inner diameter 150 of the expanding section 146. Although not shown, two gas inlets 142 can be disposed at opposite sides of the expanding section 146 to create a swirling flow pattern or "vortex" flow into the expanding section 146 which helps mix the gases within the plasma cavity 149.

The first electrode 141 may have an expanding section 146 that houses the plasma cavity 149. The expanding section 146 may be in fluid communication with the gas inlet 142 as described above. The expanding section 146 may be an annular member that has an inner surface or diameter 150 that gradually increases from an upper portion 147 thereof to a lower portion 148 thereof. As such, the distance between the first electrode 141 and the second electrode 152 is variable. That varying distance helps control the formation and stability of the plasma generated within the plasma cavity 149. The expanding section 146 may resemble a cone or "funnel," as is shown in FIGS. 3 and 4. The inner surface 150 of the expanding section 146 may gradually slope from the upper portion 147 to the lower portion 148 of the expanding section 146. The slope or angle of the inner diameter 150 can vary depending on process requirements and/or process limitations. The length or height of the expanding section 146 can also vary depending on specific process requirements and/or limitations. The slope of the inner diameter 150, or the height of the expanding section 146, or both may vary depending on the volume of plasma needed for processing.

Not wishing to be bound by theory, it is believed that the variation in distance between the two electrodes 141, 152 allows the plasma formed in the plasma cavity 149 to find the necessary power level to sustain itself within some portion of the plasma cavity 149, if not throughout the entire plasma cavity 149. The plasma within the plasma cavity 149 is therefore less dependent on pressure, allowing the plasma to be generated and sustained within a wider operating window. As such, a more repeatable and reliable plasma can be formed within the lid assembly 140.

The first electrode 141 can be constructed from any process compatible materials, such as aluminum, anodized aluminum, nickel plated aluminum, nickel plated aluminum 6061-T6, stainless steel as well as combinations and alloys thereof, for example. In one or more embodiments, the entire first electrode 141 or portions thereof are nickel coated to reduce unwanted particle formation. Preferably, at least the inner surface 150 of the expanding section 146 is nickel plated.

The second electrode 152 can include one or more stacked plates. When two or more plates are desired, the plates should be in electrical communication with one another. Each of the plates should include a plurality of apertures or gas passages to allow the one or more gases from the plasma cavity 149 to flow through.

The lid assembly 140 may further include an isolator ring 151 to electrically isolate the first electrode 141 from the second electrode 152. The isolator ring 151 can be made from aluminum oxide or any other insulative, process compatible material. Preferably, the isolator ring 151 surrounds or substantially surrounds at least the expanding section 146.

The second electrode 152 may include a top plate 153, distribution plate 158 and blocker plate 162 separating the substrate in the processing chamber from the plasma cavity. The top plate 153, distribution plate 158 and blocker plate 162 are stacked and disposed on a lid rim 164 which is connected to the chamber body 101 as shown in FIG. 3. As is known in the art, a hinge assembly (not shown) can be used to couple the lid rim 164 to the chamber body 101. The lid rim 164 can include an embedded channel or passage 165 for housing a heat transfer medium. The heat transfer medium can be used for heating, cooling, or both, depending on the process requirements.

The top plate 153 may include a plurality of gas passages or apertures 156 formed beneath the plasma cavity 149 to allow gas from the plasma cavity 149 to flow therethrough. The top plate 153 may include a recessed portion 154 that is adapted to house at least a portion of the first electrode 141. In one or more embodiments, the apertures 156 are through the cross section of the top plate 153 beneath the recessed portion 154. The recessed portion 154 of the top plate 153 can be stair stepped as shown in FIG. 4 to provide a better sealed fit therebetween. Furthermore, the outer diameter of the top plate 153 can be designed to mount or rest on an outer diameter of the distribution plate 158 as shown in FIG. 4. An o-ring type seal, such as an elastomeric o-ring 155, can be at least partially disposed within the recessed portion 154 of the top plate 153 to ensure a fluid-tight contact with the first electrode 141. Likewise, an o-ring type seal 157 can be used to provide a fluid-tight contact between the outer perimeters of the top plate 153 and the distribution plate 158.

The distribution plate 158 is substantially disc-shaped and includes a plurality of apertures 161 or passageways to distribute the flow of gases therethrough. The apertures 161 can be sized and positioned about the distribution plate 158 to provide a controlled and even flow distribution to the processing zone 110 where the substrate 70 to be processed is located. Furthermore, the apertures 161 prevent the gas(es) from impinging directly on the substrate 70 surface by slowing and re-directing the velocity profile of the flowing gases, as well as evenly distributing the flow of gas to provide an even distribution of gas across the surface of the substrate 70.

The distribution plate 158 can also include an annular mounting flange 159 formed at an outer perimeter thereof. The mounting flange 159 can be sized to rest on an upper surface of the lid rim 164. An o-ring type seal, such as an elastomeric o-ring, can be at least partially disposed within the annular mounting flange 159 to ensure a fluid-tight contact with the lid rim 164.

The distribution plate 158 may include one or more embedded channels or passages 160 for housing a heater or heating fluid to provide temperature control of the lid assembly 140. A resistive heating element can be inserted within the passage 160 to heat the distribution plate 158. A thermocouple can be connected to the distribution plate 158 to regulate the temperature thereof. The thermocouple can be used in a feedback loop to control electric current applied to the heating element, as known in the art.

Alternatively, a heat transfer medium can be passed through the passage 160. The one or more passages 160 can contain a cooling medium, if needed, to better control temperature of the distribution plate 158 depending on the process requirements within the chamber body 101. As mentioned above, any heat transfer medium may be used, such as nitrogen, water, ethylene glycol, or mixtures thereof, for example.

The lid assembly 140 may be heated using one or more heat lamps (not shown). Typically, the heat lamps are arranged about an upper surface of the distribution plate 158 to heat the components of the lid assembly 140 including the distribution plate 158 by radiation.

The blocker plate 162 is optional and may be disposed between the top plate 153 and the distribution plate 158. Preferably, the blocker plate 162 is removably mounted to a lower surface of the top plate 153. The blocker plate 162 should make good thermal and electrical contact with the top plate 153. The blocker plate 162 may be coupled to the top plate 153 using a bolt or similar fastener. The blocker plate 162 may also be threaded or screwed onto an out diameter of the top plate 153. The blocker plate 162 includes a plurality of apertures 163 to provide a plurality of gas passages from the top plate 153 to the distribution plate 158. The apertures 163 can be sized and positioned about the blocker plate 162 to provide a controlled and even flow distribution the distribution plate 158.

Figure 5:
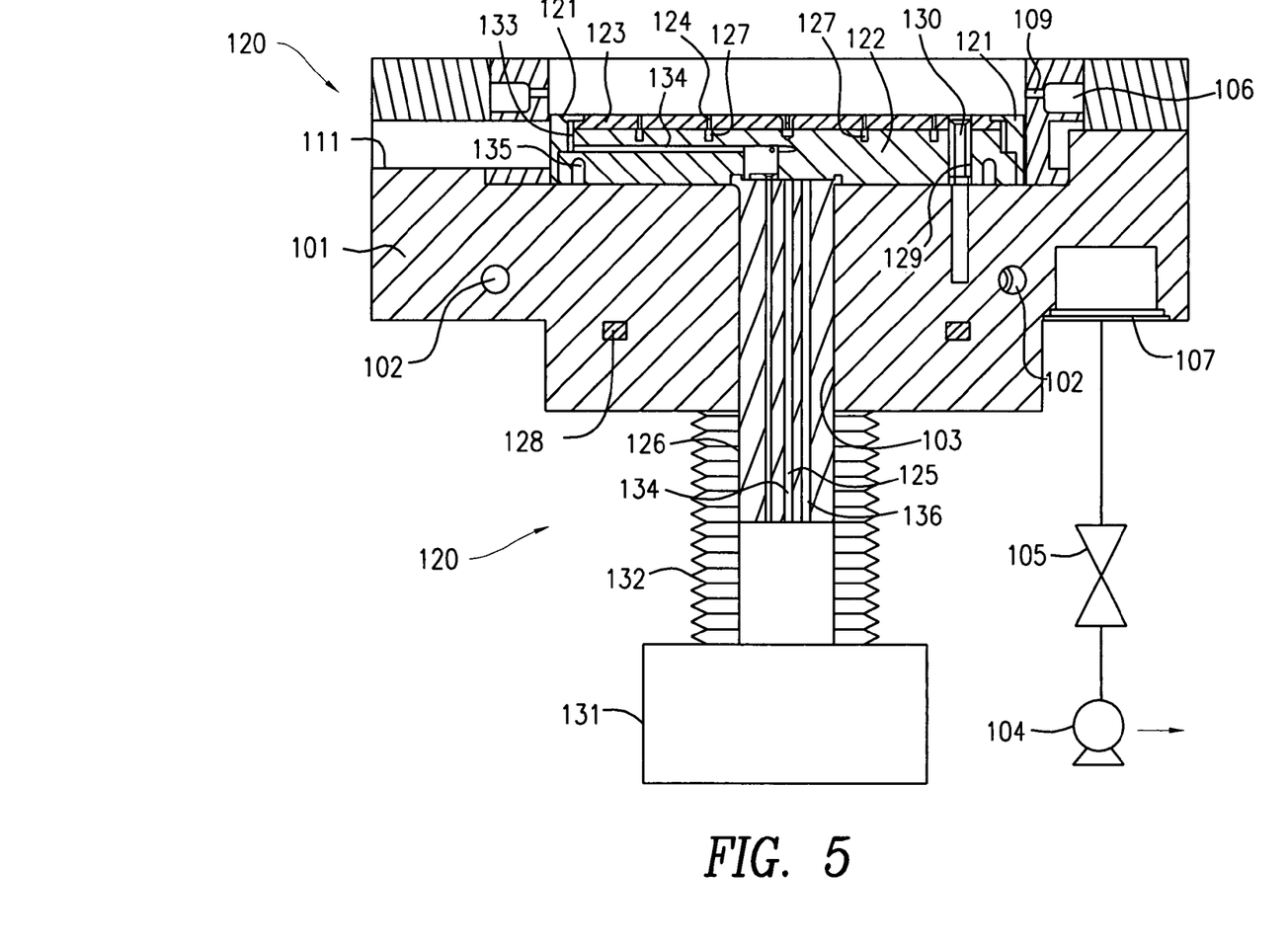
FIG. 5 shows a partial cross sectional view of a support assembly shown in FIG. 3.

FIG. 5 shows a partial cross sectional view of an illustrative support assembly 120. The support assembly 120 can be at least partially disposed within the chamber body 101. The support assembly 120 can include a support member 122 to support the substrate 70 (not shown in this view) for processing within the chamber body 101. The support member 122 can be coupled to a lift mechanism 131 through a shaft 126 which extends through a centrally-located opening 103 formed in a bottom surface of the chamber body 101. The lift mechanism 131 can be flexibly sealed to the chamber body 101 by a bellows 132 that prevents vacuum leakage from around the shaft 126. The lift mechanism 131 allows the support member 122 to be moved vertically within the chamber body 101 between a process position and a lower, transfer position. The transfer position is slightly below the opening of the slit valve 111 formed in a sidewall of the chamber body 101.

In one or more embodiments, the substrate 70 (not shown in FIG. 5) may be secured to the support assembly 120 using a vacuum chuck. The top plate 123 can include a plurality of holes 124 in fluid communication with one or more grooves 127 formed in the support member 122. The grooves 127 are in fluid communication with a vacuum pump (not shown) via a vacuum conduit 125 disposed within the shaft 126 and the support member 122. Under certain conditions, the vacuum conduit 125 can be used to supply a purge gas to the surface of the support member 122 when the substrate 70 is not disposed on the support member 122. The vacuum conduit 125 can also pass a purge gas during processing to prevent a reactive gas or byproduct from contacting the backside of the substrate 70.

The support member 122 can include one or more bores 129 formed therethrough to accommodate a lift pin 130. Each lift pin 130 is typically constructed of ceramic or ceramic-containing materials, and are used for substrate-handling and transport. Each lift pin 130 is slideably mounted within the bore 129. The lift pin 130 is moveable within its respective bore 129 by engaging an annular lift ring 128 disposed within the chamber body 101. The lift ring 128 is movable such that the upper surface of the lift-pin 130 can be located above the substrate support surface of the support member 122 when the lift ring 128 is in an upper position. Conversely, the upper surface of the lift-pins 130 is located below the substrate support surface of the support member 122 when the lift ring 128 is in a lower position. Thus, part of each lift-pin 130 passes through its respective bore 129 in the support member 122 when the lift ring 128 moves from either the lower position to the upper position.

When activated, the lift pins 130 push against a lower surface of the substrate 70, lifting the substrate 70 off the support member 122. Conversely, the lift pins 130 may be de-activated to lower the substrate 70, thereby resting the substrate 70 on the support member 122.

The support assembly 120 can include an edge ring 121 disposed about the support member 122. The edge ring 121 is an annular member that is adapted to cover an outer perimeter of the support member 122 and protect the support member 122. The edge ring 121 can be positioned on or adjacent the support member 122 to form an annular purge gas channel 133 between the outer diameter of support member 122 and the inner diameter of the edge ring 121. The annular purge gas channel 133 can be in fluid communication with a purge gas conduit 134 formed through the support member 122 and the shaft 126. Preferably, the purge gas conduit 134 is in fluid communication with a purge gas supply (not shown) to provide a purge gas to the purge gas channel 133. In operation, the purge gas flows through the conduit 134, into the purge gas channel 133, and about an edge of the substrate disposed on the support member 122. Accordingly, the purge gas working in cooperation with the edge ring 121 prevents deposition at the edge and/or backside of the substrate.

The temperature of the support assembly 120 is controlled by a fluid circulated through a fluid channel 135 embedded in the body of the support member 122. The fluid channel 135 may be in fluid communication with a heat transfer conduit 136 disposed through the shaft 126 of the support assembly 120. The fluid channel 135 may be positioned about the support member 122 to provide a uniform heat transfer to the substrate receiving surface of the support member 122. The fluid channel 135 and heat transfer conduit 136 can flow heat transfer fluids to either heat or cool the support member 122. The support assembly 120 can further include an embedded thermocouple (not shown) for monitoring the temperature of the support surface of the support member 122.

In operation, the support member 122 can be elevated to a close proximity of the lid assembly 140 to control the temperature of the substrate 70 being processed. As such, the substrate 70 can be heated via radiation emitted from the distribution plate 158 that is controlled by the heating element 474. Alternatively, the substrate 70 can be lifted off the support member 122 to close proximity of the heated lid assembly 140 using the lift pins 130 activated by the lift ring 128.

An exemplary dry etch process for removing silicon oxide using an ammonia ($NH_3$) and nitrogen trifluoride ($NF_3$) gas mixture performed within the processing chamber 100 will now be described. Referring to FIG. 3 and FIG. 5, the dry etch process begins by placing the substrate 70, into the processing zone 110. The substrate 70 is typically placed into the chamber body 101 through the slit valve opening 111 and disposed on the upper surface of the support member 122. The substrate 70 is chucked to the upper surface of the support member 122, and an edge purge is passed through the channel 133. The substrate 70 may be chucked to the upper surface of the support member 122 by pulling a vacuum through the holes 124 and grooves 127 that are in fluid communication with a vacuum pump via conduit 125. The support member 122 is then lifted to a processing position within the chamber body 101, if not already in a processing position. The chamber body 101 may be maintained at a temperature of between 50° C. and 80° C., more preferably at about 65° C. This temperature of the chamber body 101 is maintained by passing a heat transfer medium through the fluid channel 102.

The substrate 70 is cooled below 65° C., such as between 15° C. and 50° C., by passing a heat transfer medium or coolant through the fluid channel 135 formed within the support assembly 120. In one embodiment, the substrate 70 is maintained below room temperature. In another embodiment, the substrate 70 is maintained at a temperature of between 22° C. and 40° C. Typically, the support member 122 is maintained below about 22° C. to reach the desired substrate temperatures specified above. To cool the support member 122, the coolant is passed through the fluid channel 135. A continuous flow of coolant is preferred to better control the temperature of the support member 122.

The ammonia and nitrogen trifluoride gases are then introduced into the chamber 100 to form a cleaning gas mixture. The amount of each gas introduced into the chamber is variable and may be adjusted to accommodate, for example, the thickness of the oxide layer 72 to be removed, the geometry of the substrate 70 being cleaned, the volume capacity of the plasma, the volume capacity of the chamber body 101, as well as the capabilities of the vacuum system coupled to the chamber body 101. In one aspect, the gases are added to provide a gas mixture having at least a 1:1 molar ratio of ammonia to nitrogen trifluoride. In another aspect, the molar ratio of the gas mixture is at least about 3 to 1 (ammonia to nitrogen trifluoride). Preferably, the gases are introduced in the chamber 100 at a molar ratio of from 5:1 (ammonia to nitrogen trifluoride) to 30:1. More preferably, the molar ratio of the gas mixture is from about 5 to 1 (ammonia to nitrogen trifluoride) to about 10 to 1. The molar ratio of the gas mixture may also fall between about 10:1 (ammonia to nitrogen trifluoride) to about 20:1.

A purge gas or carrier gas may also be added to the gas mixture. Any suitable purge/carrier gas may be used, such as argon, helium, hydrogen, nitrogen, or mixtures thereof, for example. Typically, the overall gas mixture is from about 0.05% to about 20% by volume of ammonia and nitrogen trifluoride; the remainder being the carrier gas. In one embodiment, the purge or carrier gas is first introduced into the chamber body 101 before the reactive gases to stabilize the pressure within the chamber body 101.

The operating pressure within the chamber body 101 can be variable. Typically, the pressure is maintained between about 500 mTorr and about 30 Torr. Preferably, the pressure is maintained between about 1 Torr and about 10 Torr. More preferably, the operating pressure within the chamber body 101 is maintained between about 3 Torr and about 6 Torr.

RF power from about 5 to about 600 Watts is applied to the first electrode 141 to ignite a plasma of the gas mixture within the plasma cavity 149. Preferably, the RF power is less than

100 Watts. More preferable is that the frequency at which the power is applied is relatively low, such as less than 100 kHz. Preferably, the frequency ranges from about 50 kHz to about 90 kHz. Because of the lower electrode 153, the blocker plate 162 and the distribution plate 158, plasma ignited within the plasma cavity 149 does not contact the substrate 70 within the processing zone 110, but instead remains trapped within the plasma cavity 149. The plasma is thus remotely generated in the plasma cavity 149 with respect to the processing zone 110. That is, the processing chamber 100 provides two distinct regions: the plasma cavity 149 and the processing zone 110. These regions are not communicative with each other in terms of plasmas formed in the plasma cavity 149, but are communicative with each other in terms of reactive species formed in the plasma cavity 149. Specifically, reactive species resulting from the plasma can exit the plasma cavity 149 via the apertures 156, pass through the apertures 163 of the blocker plate 162, and enter into the processing zone 110 via apertures 161 of the distribution plate 158.

The plasma energy dissociates the ammonia and nitrogen trifluoride gases into reactive species that combine to form a highly reactive ammonia fluoride ($NH_4F$) compound and/or ammonium hydrogen fluoride ($NH_4F.HF$) in the gas phase. These molecules flow through the apertures 156, 163 and 161 to react with the oxide layer 72 of the substrate 70. In one embodiment, the carrier gas is first introduced into the chamber 100, a plasma of the carrier gas is generated in the plasma cavity 149, and then the reactive gases, ammonia and nitrogen trifluoride, are added to the plasma. As noted previously, the plasma formed in the plasma cavity 149 does not reach the substrate 70 disposed within the processing region or zone 110.

Not wishing to be bound by theory, it is believed that the etchant gas, $NH_4F$ and/or $NH_4F.HF$, reacts with the silicon oxide surface 72 to form ammonium hexafluorosilicate $(NH_4)_2SiF_6$, $NH_3$, and $H_2O$ products. The $NH_3$, and $H_2O$ are vapors at processing conditions and removed from the chamber 100 by the vacuum pump 104. In particular, the volatile gases flow through the apertures 109 formed in the liner 108 into the pumping channel 106 before the gases exit the chamber 100 through the vacuum port 107 into the vacuum pump 104. A thin film of $(NH_4)_2SiF_6$ is left behind on the surface of the substrate 70. This reaction mechanism can be summarized as follows:

$$NF_3 + NH_3 \rightarrow NH_4F + NH_4F.HF + N_2$$

$$6NH_4F + SiO_2 \rightarrow (NH_4)_2SiF_6 + H_2O$$

$$(NH_4)_2SiF_6 + heat \rightarrow NH_3 + HF + SiF_4$$

After the thin film is formed on the substrate surface, the support member 122 having the substrate 70 supported thereon is elevated to an anneal position in close proximity to the heated distribution plate 158. The heat radiated from the distribution plate 158 should be sufficient to dissociate or sublimate the thin film of $(NH_4)_2SiF_6$ into volatile $SiF_4$, $NH_3$, and HF products. These volatile products are then removed from the chamber 32 by the vacuum pump 104 as described above. In effect, the thin film is boiled or vaporized off from the substrate 70, leaving behind the exposed epitaxy surface 74. Typically, a temperature of 75° C. or more is used to effectively sublimate and remove the thin film from the substrate 70. Preferably, a temperature of 100° C. or more is used, such as between about 115° C. and about 200° C.

The thermal energy to dissociate the thin film of $(NH_4)_2 SiF_6$ into its volatile components is convected or radiated by the distribution plate 158. As described above, a heating element 160 may be directly coupled to the distribution plate 158, and is activated to heat the distribution plate 158 and the components in thermal contact therewith to a temperature between about 75° C. and 250° C. In one aspect, the distribution plate 158 is heated to a temperature of between 100° C. and 200° C., such as about 120° C. The lift mechanism 131 can elevate the support member 122 toward a lower surface of the distribution plate 158. During this lifting step, the substrate 70 is secured to the support member 122, such as by a vacuum chuck or an electrostatic chuck. Alternatively, the substrate 70 can be lifted off the support member 122 and placed in close proximity to the heated distribution plate 158 by elevating the lift pins 130 via the lift ring 128.

The distance between the upper surface of the substrate 70 having the thin film thereon and the distribution plate 158 is not critical and is a matter of routine experimentation. A person of ordinary skill in the art can easily determine the spacing required to efficiently and effectively vaporize the thin film without damaging the underlying substrate 70. It is believed, however, that a spacing of between about 0.254 mm (10 mils) and 5.08 mm (200 mils) is effective.

Once the film has been removed from the substrate 70, the epitaxy surface 74 has been exposed and the substrate 70 is ready for the subsequent epitaxial deposition process. The dry etch processor 32 is purged and evacuated. The cleaned substrate 70 is removed from the chamber body 101 by lowering the substrate 70 to the transfer position, de-chucking the substrate 70, and transferring the substrate 70 through the slit valve opening 111. The first robot 20 transfers the substrate 70 from the dry etch processor 32 to the epitaxial deposition reactor 34. Because the substrate 70 remains within the load-locked system 10, the substrate 70 is not exposed to any ambient air during this transfer process. That is, the plasma cavity 149, the processing zone 110 and the epitaxial deposition reactor 34 are in vacuum-tight communication with each other that prevents unwanted oxygen from entering into any of these regions. The epitaxy surface 74 thus is not contaminated with oxide, and remains cleanly exposed when the substrate 70 is loaded into the epitaxial deposition reactor 34. The epitaxial layer 76 may thus immediately be grown on the epitaxy surface 74, as previously described.

By replacing the HF-last wet cleaning step with the above-described dry clean procedure, it is possible to perform the entire epitaxy deposition process in a single load-locked system 10. Queue times are thus reduced. Moreover, it is believed that the above-described dry clean process has fewer issues of undercut due to lateral etching of oxide than HF wet etch with oxide-nitride-silicon substrates. However, it will be appreciated that anytime a process step is changed, particularly a cleaning step immediately prior to epitaxial deposition, there is a risk that the surface may not be acceptable for epitaxial deposition. Higher levels of certain elements such as oxygen, fluorine, chlorine or nitrogen may adversely affect the epitaxy process.

By way of experiment, silicon substrates were cleaned using a conventional HF-last process on a first group of substrates and a plasma dry cleaning process on a second group of substrates according to the process described above. The plasma dry cleaning process utilized ammonia and nitrogen trifluoride gases and a plasma was ignited for conversion into reactive species that combined to form a highly reactive ammonia fluoride ($NH_4F$) compound and/or ammonium hydrogen fluoride ($NH_4F.HF$) in the gas phase that was used to clean the second group of substrates. Epitaxial deposition was then performed at deposition temperatures of 850° C., 750° C., 700° C., and 650° C. Selected samples were then analyzed using X-ray diffraction (XRD) and second ion mass spectroscopy (SIMS) to determine the levels of certain elements at the epitaxial film/substrate interface. XRD analysis showed no difference between the first group of HF-last cleaned substrates and the second group of substrates dry cleaned using plasma for all deposition temperatures examined in terms of growth rate and film composition. SIMS profiles were comparable for HF-last cleaned substrates and substrates dry cleaned using plasma for epitaxial deposition performed at ≧800° C. However, higher levels of O, F, Cl, and N were observed at the substrate/epitaxy interface for epitaxial depositions performed at ≦750° C. depositions using the dry clean etching process. An in-situ bake with HCl prior to deposition of the dry cleaned substrates did not reduce the remaining elements at the interface mentioned above. Nevertheless, this limited set of experiments indicated that dry cleaning using plasma is an acceptable substitute for the HF-last process currently used prior to epitaxial deposition. Further tuning and refinement of the apparatus and process is expected to reduce the levels of O, F, Cl and N observed in substrates processed below 750° C.

It is believed that reactive species other than those described above are possible for the dry etching step; for example, an addition of hydrogen plasma may help reduce the levels of residual elements. That is, other types of gases may be introduced into the gas delivery system 220 and formed into a plasma that is remote from the substrate 70. The plasma so formed may form reactive species that subsequently travel to, and react with, the oxide surface 72 on the substrate 70 to thereby expose the epitaxy surface 74. The substrate 70 may be heated or cooled as required to support the removal of the oxide layer 72.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

The invention claimed is:

1. An epitaxial deposition method comprising:
   introducing a substrate having an oxide layer into a processing chamber;
   introducing a gas mixture into a plasma cavity;
   energizing the gas mixture to form a plasma of reactive gas in the cavity;
   introducing into the processing chamber the reactive gas;
   reacting the substrate with the reactive gas to form a volatile film while maintaining the substrate at a temperature below 65° C. while the substrate reacts with the reactive gas;
   heating the substrate to a temperature of at least about 75° C. to vaporize the volatile film and remove the oxide layer, thereby exposing an epitaxy surface; and
   forming an epitaxial layer on the epitaxy surface.

2. The method of claim 1 wherein the plasma does not contact the substrate.

3. The method of claim 2 wherein the plasma cavity is separated from the processing chamber.

4. The method of claim 3, wherein the plasma cavity comprises a first electrode connected to a power source and a second electrode connected to a ground.

5. The method of claim 4, wherein the second electrode comprises a top plate, distribution and plate blocker plate separating the substrate in the processing chamber from the plasma cavity.

6. The method of claim 1 wherein forming the epitaxial layer comprises moving the substrate into an epitaxial deposition reactor without exposing the substrate to ambient air.

7. The method of claim 6 wherein the plasma cavity, the processing chamber, and the epitaxial deposition reactor, are all vacuum-connected to a multi-chamber processing system.

8. The method of claim 1 wherein the substrate is heated to a temperature of at least 100° C.

9. The method of claim 8 wherein the substrate is heated to a temperature of 100° C. and 200° C.

10. The method of claim 1 wherein the gas mixture comprises ammonia ($NH_3$) and nitrogen trifluoride ($NF_3$), wherein the reactive gas comprises ammonia fluoride ($NH_4F$) or ammonium hydrogen fluoride ($NH_4F \cdot HF$), and the volatile film comprises ammonium hexafluorosilicate (($NH_4$)$_2SiF_6$).

* * * * *